United States Patent

Tai et al.

[11] Patent Number: 5,546,326
[45] Date of Patent: Aug. 13, 1996

[54] DYNAMIC DISPATCHING RULE THAT USES LONG TERM DUE DATE AND SHORT TERM QUEUE TIME TO IMPROVE DELIVERY PERFORMANCE

[75] Inventors: Wei-Heng Tai, Hsin-Chu; Yi-Chin Hsu, Taipei, both of Taiwan

[73] Assignee: Taiwan Semiconductor Manufacturing Company Ltd, Hsin-Chu, Taiwan

[21] Appl. No.: 416,165

[22] Filed: Apr. 4, 1995

[51] Int. Cl.$^6$ .................................................. G06F 19/00
[52] U.S. Cl. ..................................... 364/552; 364/468.05
[58] Field of Search ........................... 364/401, 402, 364/403, 468, 552; 395/3, 50, 61, 904, 906

[56] References Cited

U.S. PATENT DOCUMENTS

| | | | |
|---|---|---|---|
| 5,093,794 | 3/1992 | Howie et al. | 364/468 |
| 5,210,041 | 5/1993 | Kobayashi et al. | 437/8 |
| 5,219,765 | 6/1993 | Yoshida et al. | 437/8 |
| 5,240,866 | 8/1993 | Friedman et al. | 437/8 |
| 5,321,620 | 6/1994 | Tanaka et al. | 364/468 |
| 5,343,388 | 8/1994 | Wedelin | 364/402 |
| 5,442,731 | 8/1995 | Tanaka et al. | 395/50 |

*Primary Examiner*—James P. Trammell
*Attorney, Agent, or Firm*—George O. Saile; Graham S. Jones, II

[57] ABSTRACT

This is a dynamic dispatching method for delivery performance by a factory. SLACK=(Due_Date-Now)-(Forecast_FAB_Out_Time); where Due_Date=Scheduled due date from Master Production Schedule. The OTD (On Time Delivery) dynamic dispatching method focuses on the due date and the target cycle time under the environment of integrated circuit manufacturing. SLACK policy controls the long term due date and the OTD policy reflects the short term stage queue time. Through fuzzy theory, SLACK and OTD policies are combined as a dispatching controller to control the lot priority of the entire production line. The work piece, with either a long stage queue time, or with an urgent due date is pushed through the overall production line instead of jamming the front end of the process. A demand pull system satisfies the due date and the quantity of monthly demand.

32 Claims, 6 Drawing Sheets

|     | ITEM | WEEK1 | WEEK2 | WEEK3 | WEEK4 | TOTAL |
|-----|------|-------|-------|-------|-------|-------|
| FEB | SCHEDULE | 60 | 47 | 52 | 34 | 193 |
|     | ACHIEVEMENT ITEM | 42 | 19 | 29 | 20 | 110 |
|     | FCLIP | 70 | 57 | 56 | 56 | 56 |

|     | ITEM | WEEK1 | WEEK2 | WEEK3 | WEEK4 | TOTAL |
|-----|------|-------|-------|-------|-------|-------|
| MAR | SCHEDULE | 50 | 59 | 52 | 23 | 184 |
|     | ACHIEVEMENT ITEM | 33 | 33 | 33 | 15 | 114 |
|     | FCLIP | 66 | 60 | 61 | 61 | 61 |

|     | ITEM | WEEK1 | WEEK2 | WEEK3 | WEEK4 | TOTAL |
|-----|------|-------|-------|-------|-------|-------|
| APR | SCHEDULE | 97 | 60 | 51 | 37 | 245 |
|     | ACHIEVEMENT ITEM | 70 | 37 | 32 | 16 | 155 |
|     | FCLIP | 72 | 68 | 66 | 63 | 63 |

|     | ITEM | WEEK1 | WEEK2 | WEEK3 | WEEK4 | TOTAL |
|-----|------|-------|-------|-------|-------|-------|
| MAY | SCHEDULE | 83 | 67 | 59 | 62 | 271 |
|     | ACHIEVEMENT ITEM | 56 | 47 | 49 | 50 | 202 |
|     | FCLIP | 67 | 68 | 72 | 74 | 74 |

|     | ITEM | WEEK1 | WEEK2 | WEEK3 | WEEK4 | TOTAL |
|-----|------|-------|-------|-------|-------|-------|
| JUN | SCHEDULE | 107 | 68 | 59 | 45 | 279 |
|     | ACHIEVEMENT ITEM | 90 | 57 | 45 | 35 | 227 |
|     | FCLIP | 84 | 84 | 82 | 81 | 81 |

FIG. 9

DYNAMIC DISPATCHING RULE THAT USES LONG TERM DUE DATE AND SHORT TERM QUEUE TIME TO IMPROVE DELIVERY PERFORMANCE

BACKGROUND OF THE INVENTION

1. Field of the Invention

This invention relates to computer control of work flow in a manufacturing production line and more particularly to automation of production control of a manufacturing process by improved automation of scheduling of work.

2. Description of Related Art

In the manufacture of integrated circuit semiconductor devices, semiconductor wafer dispatching used to be controlled by the C/R (Critical Ratio) that indicates the degree of customer dissatisfaction. The overall slack time in the front end of the line (near the beginning of the production line) procedure is greater compared to that in the rear end of the line (near the finishing end of the production line) procedure revealing that the machine in the rear end of the line are overloaded by a rush order.

The manufacturing process involved in integrated circuit (IC) fabrication is complex and unique. A wafer may return to be processed by the same manufacturing tool, i.e. machine, several times and the wafer can return repeatedly to the same stage for different processes that construct a flexible but sophisticated module and a re-entrant process flow in this environment, for use in production scheduling, there are several factors which are to be used to measure performance. Such measures of performance are machine utilization, throughput, due date and stage cycle time. Many dispatching rules have therefore been developed to fulfill the objective.

Research on efficient scheduling policies to reduce mean and variance of cycle-time and variance of cycle-time in semiconductor manufacturing plants has compared several scheduling policies for reducing mean and variance of cycle time. An experimental model comprising a single product with an IC manufacturing re-entrant process showed that the fluctuation smoothing policy—least slack policy indicates improved performance. A scheduling method has been tried using the first in first out (FIFO) policy. Most of the research is based upon an environment which is slightly different from a real case.

Yoshida et al U.S. Pat. No. 5,219,765 "Method for Manufacturing a Semiconductor Device Including Wafer Aging, Probe Inspection, and Feeding Back the Results of the Inspection to the Device Fabrication Process" describes a method for manufacturing semiconductor devices including a test from which information is fed back into the fabrication process for improvement.

Friedman et al U.S. Pat. No. 5,240,866 "Method for Characterizing Failed Circuits on Semiconductor Wafers" shows a method for characterizing failed circuits on semiconductor wafers.

Kobayashi et al U.S. Pat. No. 5,210,041 "Process for Manufacturing Semiconductor Integrated Circuit Device" shows computer control of testing/feedback to a chip manufacturing process.

SUMMARY OF THE INVENTION

Glossary $i=1,2,3\ldots,N$, (where N=number of stages)
$j=1,2,3\ldots,M$, (where M=number of different technologies)
TTDD=Time to Due Date
TSSC=Target Standard Stage Cycle-Time
FFOT=(Forecast_FAB_Out_Time)
  Refers to statistical Information and queueing theory to obtain a steady standard out time.
$FFOT_{ij}$=forecast part flow time for technology j from stage i to stage N
Due_Date=Scheduled due date from MPS (Master Production Schedule)
TSC=Target Stage Cycle time
QT=Queue Time (for stage)
OTD=(On Time Delivery)=TSC−4QT
SLACK=(Due_Date−Now)−(FFOT)
$B_i$=theoretical cycle time for stage i
$TSSC_i$=run time, wait time (including hold time) for stage i
$CT_i$=cumulative theoretical cycle time from stage i to stage N
$CS_i$=cumulative run time, wait time (including hold time) from stage i to stage N
$CCR_i$=cumulative critical ratio for stage i
$PCT_j$=theoretical total part flow time for technology j
$PCT_{ij}$=theoretical part flow time for technology j from stage i to stage N
$HCT_j$=average cycle time for past 3 months for technology j
$R_j$=modification reference for technology j
F=adjustment parameter (=1 hence there is no accidental factor appears)
FCLIP=Fab Confirmed Line Item Performance=$\Sigma X_i / Y * 100\%$
Y=total number of order line items, confirmed to deliver in the measured period for each item i in Y
$X_i=1$, if delivered on or before the confirmed date and delivery volume met one of the following:
  1. >=90% of the commitment,
  2. >=guaranteed volume, for pilot, engineering or developing run order
$X_i=0$, if the above conditions are not met.
GDL=Global Dispatching List In accordance with this invention a manufacturing control system and a method of control of a manufacturing control system by computer control of work flow in automatic control of a manufacturing production line are provided. The method includes the steps as follows:

providing comparison from positive data and negative feedback data, providing input TTDD data and TSSC data as a positive input, providing comparison output from the TTDD data, the TSSC data and from the negative feedback data, providing a SLACK & OTD control processing in response to the output from the comparison output, the SLACK & OTD control processing providing FFOT and QT output data, the FFOT and QT output data being provided to the feedback input for the comparison, whereby automation of production control of a manufacturing process is provided by improved automation of work scheduling.

Preferably, quantity control is provided based upon the FFOT and QT output data;

the quantity control being provided based upon the FFOT and QT output data is provided by reviewing product to determine whether product is adequate or inadequate, and resetting as first priority in the case of inadequate product.

It is preferred that $FFOT_{ij}=R_j*CCR_i*PCT_{ij}*F$; and that OTD=TSC−QT.

BRIEF DESCRIPTION OF THE DRAWINGS

The foregoing and other aspects and advantages of this invention are explained and described below with reference to the accompanying drawings, in which:

FIG. 9 shows a Table reflecting the variability of product delivery for a manufacturing line with a steady production environment from February to June.

DESCRIPTION OF THE PREFERRED EMBODIMENT

In the manufacture of integrated circuit semiconductor devices, control of the wafer due date is improved. A wafer with either a long stage queue time or an urgent due date is pushed through an overall production line instead of using a procedure of jamming up the front end of the line.

This invention employs a semiconductor wafer dispatching method which is controlled by the dynamic dispatching rule named SLACK & OTD (On Time Delivery.) SLACK & OTD focuses on the due date and the target cycle time in a real life environment. The long term due date is controlled by the traditional SLACK policy. The OTD rule is a new policy which operates based upon the short-term stage queue time. In accordance with this invention, these two policies are combined by means of the fuzzy theory.

Figure 1:
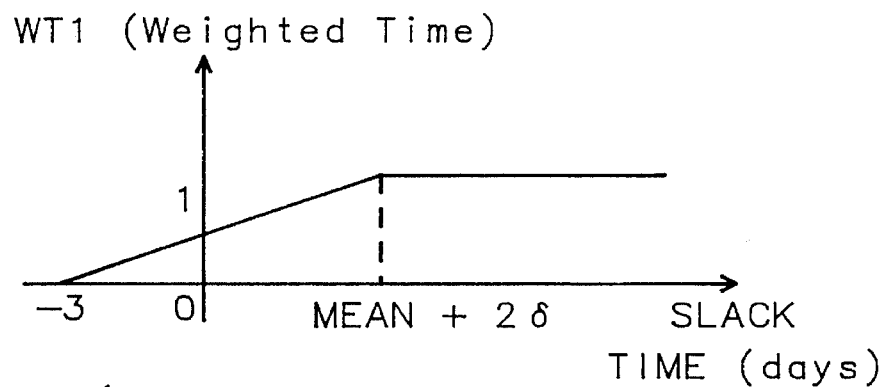
FIG. 1 which is a graph of weighted time vs. slack time in days.
Figure 2:
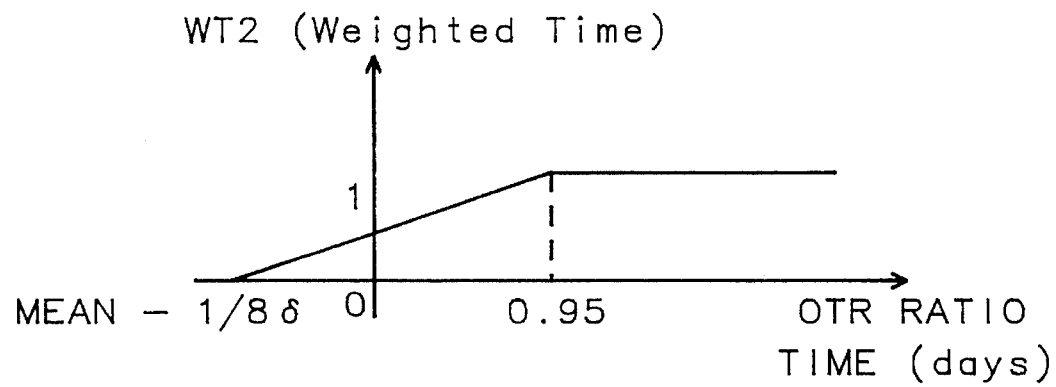
FIG. 2 is a graph of weighted time vs. OTD

With reference to FIG. 1 which is a graph of weighted time vs. slack time in days, the concept of "SLACK" is defined as follows:

SLACK = (Due_Date–Now) – (FFOT)

where
- Due_Date = Scheduled due date from MPS (Master Production Schedule)
- FFOT (Forecast_FAB_Out_Time) = Refers to statistical information and queueing theory to obtain a steady standard out time.

when
- SLACK < –3 : Absolutely push
- –3 < SLACK < MEAN + 2σ : Fuzzy region
- SLACK < MEAN + 2σ : Absolutely slow With reference to FIG. 2 is a graph of weighted time vs. OTD, the concept of "OTD" is defined as follows:

OTD=STC–QT where
- STC=Standard stage cycle time
- QT=Queue Time (for Stage)
- OTR=OTD/STC when
- OTR<MEAN–1.8σ: Absolutely push
- MEAN–1.8σ<OTR<0.95: Fuzzy region
- OTR>0.95: Absolutely slow

WT=MIN. (WT1, WT2)

where
- WT1=a1*S+b1
  transformation value of SLACK between 0 and 1
- WT2=a2*OTR+b2
  transformation value of OTR between 0 and 1

Then sort WT value of whole production line in ascending order to figure the lot priority in the distribution in Table I which follows:

|  | small → | (WT value) → | | large → |
|---|---|---|---|---|
|  | 25% | 40% | 30% | 5% |
| Priority | 1 | 2 | 3 | 4 |

Figure 3:
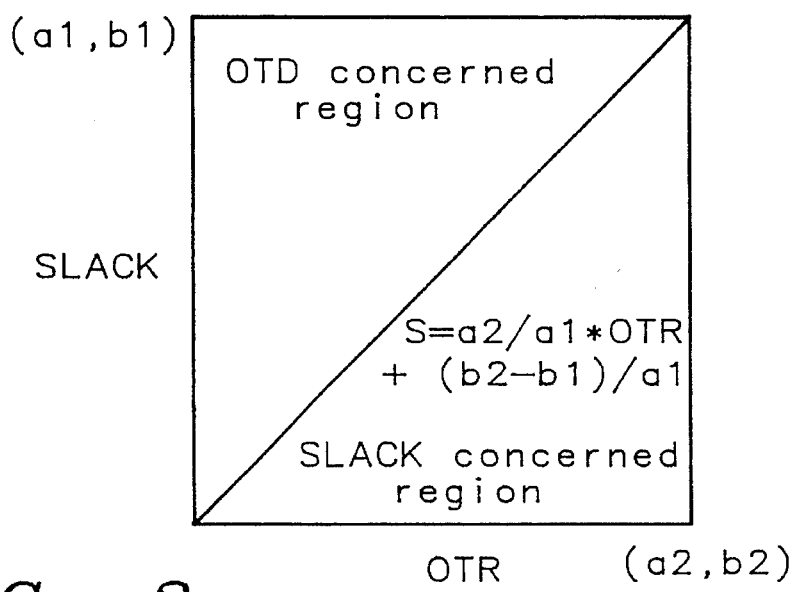
FIG. 3 is a box chart of Slack and OTR recognize the part flow situation of the entire production line by identifying which rule is concerned.

Furthermore, one uses the box chart of Slack and OTR as seen in FIG. 3 to recognize the part flow situation of the entire production line by identifying which rule is concerned.

The marginal line that the SLACK and OTR has the equal value and would be considered simultaneously is calculated as follows:

when $$W1=W2 \rightarrow a1*S+b1=a2*OTR+b2 \rightarrow S=a2/a1*OTR+(b2-b1)/a1$$

In a typical company of the production-to-order type, there are various specialities that indicate that the dispatching rules such as the critical ratio, FIFO, least slack time and least queue time cannot produce a stable and satisfactory outcome of the manufacturing scheduling process. The difficulties being encountered are complex product mix, high machine down time and manual operation. Currently, for example the manufacturing line can be producing dozens to more than 100 devices and several tens of different processes are performed. On the other hand, picking a waiting wafer by means of a manually operated system can hardly fully follow the scheduling plan. How to conquer the adverse factors stated above and simultaneously to produce the correct quantity of products at the correct time is the major object of this invention.

Therefore the new rule has been developed for focusing on due date and target cycle time in a real life environment. This rule uses the traditional SLACK policy to control the long term due date and the new OTD (On Time Delivery) policy to reflect the short-term stage queue time. Through combining these two policies, the OTD policy compensates for the shortages which develop when solely the SLACK rule is followed. The system operating with the SLACK & OTD rule automatically updates the lot priority according to the current line situation. A demand pull system is also constructed to satisfy not only the due date, but also the quantity of monthly demand.

In practice the SLACK & OTD dynamic lot priority dispatching rule has been executed and the resultant performance indices show that due date control has been improved. This is based upon a real IC manufacturing environment.

PROBLEM ANALYSIS

In an IC manufacturing environment, machine instability and re-entrant processes increase the complexity of production scheduling, either directly or indirectly. Especially when production is totally driven by demand as measured by product demand orders, various integrated circuit (IC) manufacturing processes increase the unknown factors involved in production control, as described above. From the point of view of production control, the MPS (Master Production Schedule,) which is derived from product demand orders, varies as a function of due date. The MPS also varies to a lesser degree as a function of lot dispatching to further achieve the targeted delivery date/quantity. The principal focus of this invention is to control overall production cycle time and to meet MPS due dates precisely, under such highly fluctuating circumstances. In a commercial manufacturing environment, this is a very difficult problem.

A perfect manufacturing system is a dynamic controllable mechanism which deals with fluctuating circumstances and which supports MPS. With no fixed rule, there is a risk of uncertainty caused by IC production characteristics.

Therefore, the focus is how to provide exact scheduling of the priority of lot dispatching from the combined points of view of as follows:
1) the long term (overall production cycle time) and
2) the shorter term (job shop cycle time) perspective.

This concept is based on the idea of due date control and simply integrates long and a short term lot dispatching rules through fuzzy theory to provide a dynamic self-adjusting system. The performance of target achievement that reflects on the due date can be evaluated by developed indices.

Lot dispatching control is usually subjective. Therefore, a demand pulls system is constructed from weekly demand to offset the deficiency of SLACK and OTD system. A flexible manufacturing system is built on a concept possessing the specialty of both consideration of the due date and quantity and it emphasizes the controllable production cycle time to accomplish the exact due date request.

DYNAMIC DISPATCHING RULE-SLACK AND OTD

Global Available Time-SLACK

According to the forecast delivery times of wafers and the scheduled delivery time of such wafers, the slack can be calculated and then can be considered for setting the production priority that allocates the machine capacity to those wafers efficiently to those wafers with less global (whole production line) time available. Under the manufacturing structure of a single product, the slack policy improves the mean cycle time and the variance of cycle time.

The concept of "SLACK" is defined as follows:
SLACK=(Due_Date-Now)-(FFOT), where
Due_Date=Scheduled due date from MPS
FFOT (Forecast_
FAB_Out_Time)=Refers to statistical information and queueing theory to obtain a steady standard out time.

In accordance with this invention an algorithm is employed comprising, FFOT (Forecast_FAB_Out_Time.) In the manufacturing environment of multi-product and the various processes factors involved are as follows:
1. Special process
2. Complex job shop variety and specialty.
3. High machine down time.
4. Different throughput from every job shop.
5. High variance of production cycle time (every product, every job shop.)

Therefore, the FFOT, Steady_Standard_Production_Cycle Time (SSPCT) is defined by focussing on the individual processes and job shops and using long term statistical data as a reference. That statistical data is then used with an algorithm based upon queueing analysis as follows:
1. Use the theoretical cycle time (CT) for every stage of the process to calculate the cumulative run time before finishing the manufacturing process:

$CTi = \Sigma_{k=i} B_k$, for $i=1 \ldots N$

2. For every stage, compute the actual cycle time (including run time, wait time, and hold time) in order to obtain the cumulative process time from current stage (CS) until completion of the process:

$CSi = \Sigma_{k=i} TSSC_k$, for $i=1 \ldots N$

3. Calculate the critical ratio for cumulative process time to cumulative theoretical cycle time to reflect the special characteristics of every stage and smooth the deviation of the estimate from the difference between stages:

$CCRi = CSi/CTi$, for $i=1 \ldots N$

4. Get the reference for revising the forecast cycle time by using history data; therefore the forecast cycle time in the first stage is meaningful:

$Rj = HCTj/CCRi*PCTj$, for $i=1 \ldots M$

5. Combine the theoretical cycle time with modification history data to obtain the real value of the FFOT (Forecast_FAB_Out_Time)

$FFOTij = Rj*CCRi*PCTij*F$ where

| | |
|---|---|
| i | (1, 2, 3 ..., N, (where N = number of stages) |
| j | 1, 2, 3 ..., M, (where M = number of different technologies) |
| Bi | theoretical cycle time for stage i |
| TSSCi | run time, wait time (including hold time) for stage i |
| CTi | Cumulative theoretical cycle time from stage i to stage N |
| CSi | cumulative run time, wait time (including hold time) from stage i to stage N |
| CCRi | cumulative critical ratio for stage i |
| PCTj | theoretical total part flow time for technology j |
| PCTij | theoretical part flow time for technology j from stage i to stage N |

| | |
|---|---|
| HCTj | average cycle time for past 3 months for technology j |
| Rj | modification reference for technology j |
| FFOTij | forecast part flow time for technology j from stage i to stage N |
| F | adjustment parameter (=1 hence there is no accidental factor appears) |

In a manufacturing structure of multi-products and various processes, when the entire production line is controlled solely by the SLACK policy, the problems encountered are as follows:

1. When a lot goes further through the rear end of the process, the cumulative interruption time (machine down, labor idleness, and problem management) is increased also. Therefore, the overall slack time in the front end is greater as compared to that in the rear end that indicates the machines in front are mostly idled and that the machines in the rear end process functions are overloaded by a rush order.

2. The WIP (Work in Progress) piles up at the front end instead of the rear end of the production line that reveals the situation of WIP unbalances.

3. Since most of the slack time is consumed in the front end of the production line, the rear end of the line shares the redistricted slack time with highly uncertain risk implying that the delivery quantity could be lost easily in a way that can hardly be remedied.

4. The production cycle time is totally affected by the schedule due date from MPS. Hence, it would be out of control if the schedule were unreasonable or if one were not to consider the situation in a particular stage.

Therefore, we presume that an impeccable dispatching rule should consider the objective of overall production schedule and reduce the uncertain risk from the short term concern. Hence, to define a reasonable target cycle time of single job shop can balance the production line in this complex manufacturing circumstance.

Local Available Time-OTD (On Time Delivery)

Opposed to the shortage of slack dispatching rule, the WIP and production rate in the overall procedure can be allocated more smoothly then appropriately against the complexity and high machine down time in IC manufacturing environment. In other words, we use not only the estimated slack time as the control standards, but also ask for the wafer moving to every next stage within the standard period. We define the control rule as follows:

$$OTD = TSC - 4QT$$

where

TSC=Target Stage Cycle time

QT=Queue Time (for stage).

This method, as queue time control, sets up a standard production cycle time for every job shop. In fact, it offers a short term due date for every job shop. Based upon statistical data and lot priority, then calculate the percentage to proportionate the target cycle time for lots with different priorities, in regard to lots with different priorities and different target cycle times.

Primarily, four categories have been interpreted as indicated in the Table II which follows:

TABLE II

| Lot Priority | Percentage Value | Target Stage Cycle Time |
|---|---|---|
| Extra Urgent | 87%= (Mean C/T − 2*Std.)/Mean C/T | TSC* 87% |
| Urgent | 94%= (Mean C/T − 1*Std.)/Mean C/T | TSC* 94% |
| Slow | 106%= (Mean C/T − 1*Std.)/Mean C/T | TSC*106% |
| Extra Slow | 113%= (Mean C/T − 2*Std.)/Mean C/T | TSC*113% |

Based upon an annual target mean and standard deviation of cycle time, the four categories of percentage values can be used to achieve the expected value of target stage cycle time.

Conceptually, the stage cycle time is controlled to maintain the overall cycle time within the value of two standard deviations. Since slack rule can tend only to an anticipated result by a planned schedule when MPS is designed appropriately. However, the OTD rule concerns a queue time restriction of a single job shop to compensate for the shortage of high deviation of production cycle time.

Algorithm-combining SLACK and OTD to Control Lot Procession

Although the importance of the two dispatching concepts of SLACK and OTD are understood, the alternative obstacles would be encountered in practice when combining these two concepts for a composite judgment in order to obtain a reasonable and effective decision. The estimated formula that is most frequently adopted is to assign the weighted value to both SLACK and OTD and to add them together. However, from the point of view of human resolution, the decision principle should be considered individually out of some certain interval. Therefor, the method of weighted accumulation would neglect the necessity to concern the single concept or one can say that it can not satisfy the inquiry of dynamic decision reasonably.

The control system shown in FIG. 4 uses two dispatching rules stated above in the control procedure for a manufacturing system which combines the SLACK and the OTD to control lot processing operating upon TTDD and TSSC data, where such data is defined as follows:

TTDD: Time to Due Date

TSSC: Target Standard Stage Cycle-Time

The whole system concept is based on the theory of controlling deviation. FIG. 4 illustrates the structure and algorithm of a SLACK & OTD Control System.

A Long Term View Point block 30 passes data to a line 30', which supplies an output from block 30 to MPS (Master Production Schedule) block 32, which provides an output on line 32' to a first input of a TTDD and TSSC block 40.

A Short-Term View Point block 34 passes data from block 34 on line 34'. Line 34' supplies the output from block 34 to History Data of Last Three Months block 36, which provides an output on line 36' to a second input to the TTDD and TSSC block 40. Block 40 which derives the predicted values comprising TTDD (Time To Due Date) and TSSC (Target Standard Stage Cycle Time) from the data on lines 32' and 36' based on the schedule data as compared to the cycle time history.

The TTDD and TSSC block 40 supplies an output on line 40' to the input of calculator in comparator block 47 where the Slack and OTD values are calculated based upon the equations as follows:

Slack=TTDD−FFOT, and

OTD=TSSC−QT

The calculator of comparator 47 provides an output on line 47' which includes the SLACK and OTD values supplied to SLACK & OTD Value block 41, whose output passes on line 41' to SLACK & OTD Controller block 42. The output of controller 42 is supplied on line 42' as FFOT and QT on line 42'.

QT: Queue Time

FFOT: Forecasting_FAB_Out_Time

Line 42' is connected to the node (junction) 43 which leads to output line 43' to the GDL (Global Dispatching List) block 49. The output of controller 42 supplied on line 42' as FFOT and QT on line 42', branches back along the feedback loop 44 where it is fed to the negative input of the calculator of comparator 47 for subtraction from the TTDD and TSSC inputs.

In other words, the importance of every lot is categorized based upon the weighted value of SLACK and OTDR of that lot. By utilizing this algorithm, the degree of priority or the degree of emergency status of every lot in process on the entire line can be determined. The information is transferred as a real number from 0 to 1 and then sorted in ascending order to determine the priority. Practically, the first 25% lots in the order are defined as being of first priority. This ratio appropriately is equal to the running ratio that is maintained in the production line. Then, the ratio of second priority is defined as 40%, third priority as 30%, and fourth priority that can be currently slowed as 5%.

Through the classification from this algorithm, the priority of global lots for production is determined and on-line dispatching is executed. The implementation of this dispatching system is illustrated in FIG. 4. Through the adjustment of movement of lots by using the SLACK and OTD Controller 42, the FFOT and the QT of every lot can be modified and affecting the precision of the delivery of the lots. Practically, since the due date arranged in a factory of a production type is actually based on the production quantity previously scheduled, if the due date is used as the only standard, the delivery quantity would not be satisfied due to the scrap problem, process problems, and other manufacturing problems.

As a practical matter, since the due date originally arranged in the factory of a given production type is actually based on the production quantity of the schedule, if the due date is used as the only standard of prioritization, the delivery quantity will not be satisfied because of the scrap problems, processing problems and other production problems which limit delivery of a quantity originally scheduled.

Figure 5:
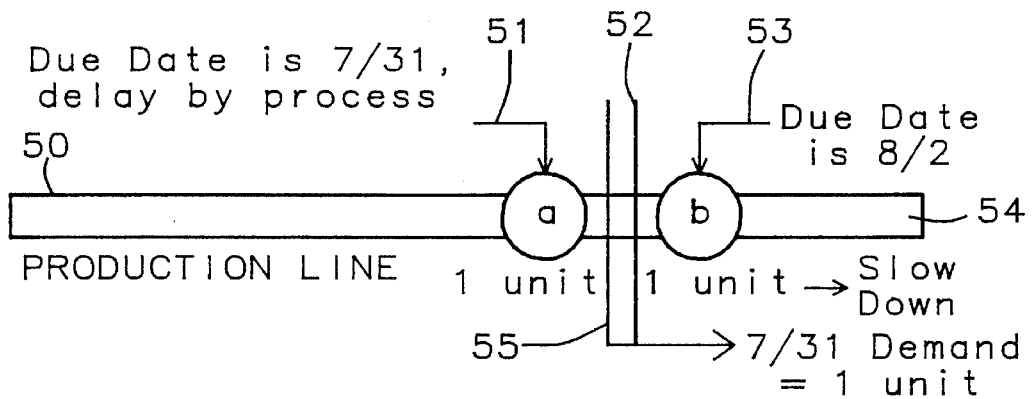
FIG. 5 shows an example of production line with product lot "a" and product lot "b", which are examples of products being manufactured.

FIG. 5 shows an example of production line 50 with product lot "a" and product lot "b", which are examples of products being manufactured. Lot "a" is originally located behind lot "b" in the queue on line 50. The due date of lot "a" is July 31 and the due date of lot "b" is August 2. The demand for July 31 is 1 unit. Thus there is a need to slow down unit "b" and give priority to unit a. At first there appears to be no difference between lots "a" and "b" when the demand for only 1 unit is considered. However, if only the due date is considered, lot "b" will be delayed by the SLACK and OTD controller 42. Through adjustment of the movement of lots "a" and "b" by using the SLACK AND OTD controller 42, the FFOT and QT of every lot can be modified and can further affect the precision of the time of delivery of a lot.

Figure 4:
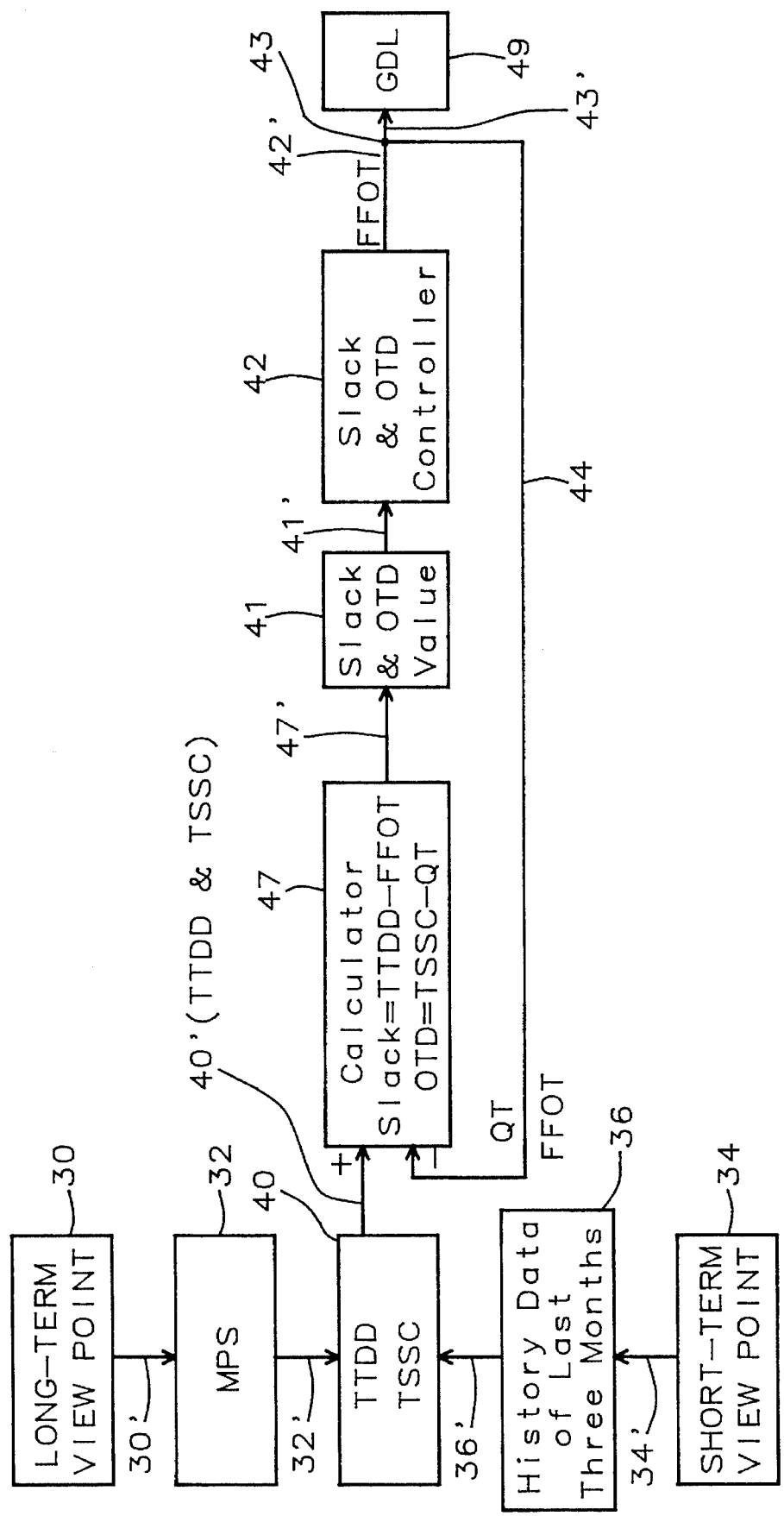
FIG. 4 shows a control system using two dispatching rules for the control procedure for a manufacturing system which combines the SLACK and the OTD to control lot processing operating upon TTDD and TSSC data.
Figure 6:
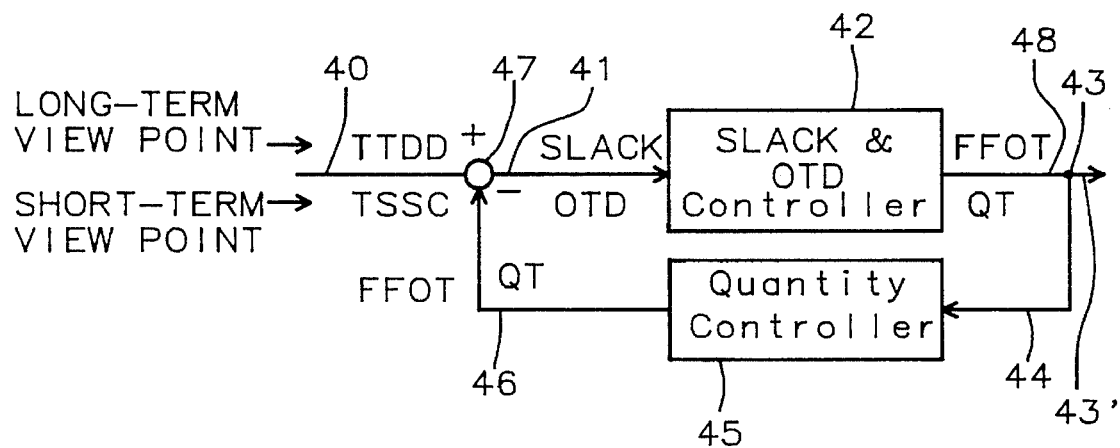
FIG. 6 shows a quantity controller added to the feedback loop of the system of FIG. 4 which modifies the production priority based upon demand and has the function of adjusting the production quantity.

Referring to FIG. 6, a quantity controller 45 has been added to the feedback loop of the system of FIG. 4. The quantity controller 45 modifies the production priority based upon demand and has the function of adjusting the production quantity. It forms a significant SLACK & OTD system. The operation procedure is to review the type and the quantity of product that is inadequate and to search for the lots that must be completed for delivery immediately. Then these lots are categorized as being of first priority regardless of what is its SLACK & OTD value.

Figure 7:
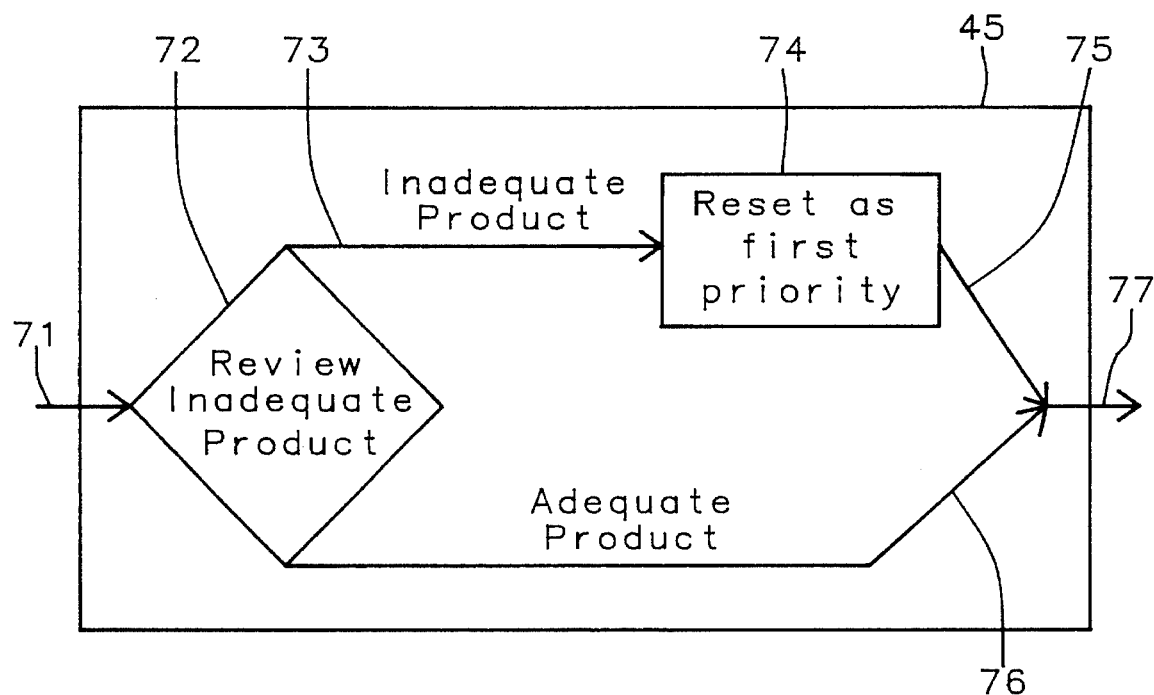
FIG. 7 shows a block diagram of the functions of the quantity controller of FIG. 6.

FIG. 7 shows a block diagram of the functions of the quantity controller 45 of FIG. 6. In decision block 72 a review is made as to whether the quantity of a product has met (satisfied) its demand. Reset block 74 is employed to deal with the factor that if the quantity of a product is not adequate we ignore its slack to OTD value and directly change its priority to push it through the production line. Block 74 sends its reset signal on line 77 to the Global Dispatching List (GDL.) Block 72 reviews to find out whether a product is adequate or not adequate and no further action is taken for and adequate product and an output on line 76 is supplied indicating the result of the test in block 72.

Box Chart: To Monitor Production Status

Figure 8:
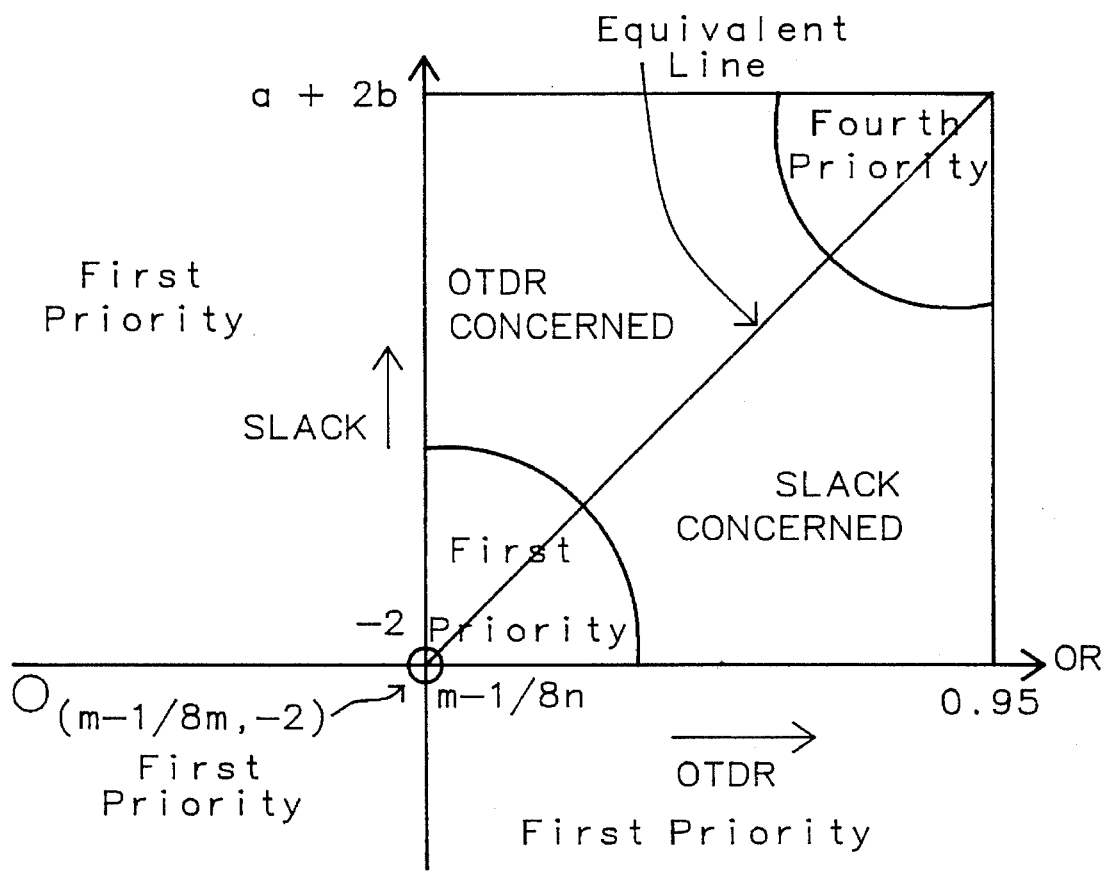
FIG. 8 is a chart relative to monitoring the SLACK & OTD policy. A box chart is employed to simulate the entire production system. The SLACK & OTD value of every lot is defined as one ordinate value L(ORi,SKi) and it is marked on the density figure of the ordinate system.

In order to monitor the SLACK & OTD policy, a box chart is employed to simulate the entire production system. The SLACK & OTD value of every lot is defined as one ordinate value L(ORi,SKi) and it is marked on the density figure of the ordinate system of FIG. 8.

From the box chart, it is possible to monitor the result of the decision policy and to display the production situation on the density figure. The production cycle time and the delivery situation can be investigated also.

Evaluation: FCLIP

In an environment of manufacturing multiple products and multiple manufacturing processes, the SLACK & OTD policy produces a satisfactory result. For focusing on the modification of product delivery, an index called FCLIP (Fab Confirmed Line Item Performance) as to the evaluation. The definition of FCLIP is as follows:

FCLIP=ΣXi/Y*100%

Y=total number of order line items, confirmed to deliver in the measured period for each item i in Y Xi=1, if delivered on or before the confirmed date and delivery volume met one of the following:

1.>=90% of the commitment,

2.>=guaranteed volume, for pilot, engineering or developing run order

Xi=0, if the above conditions are not met.

Figure 10:
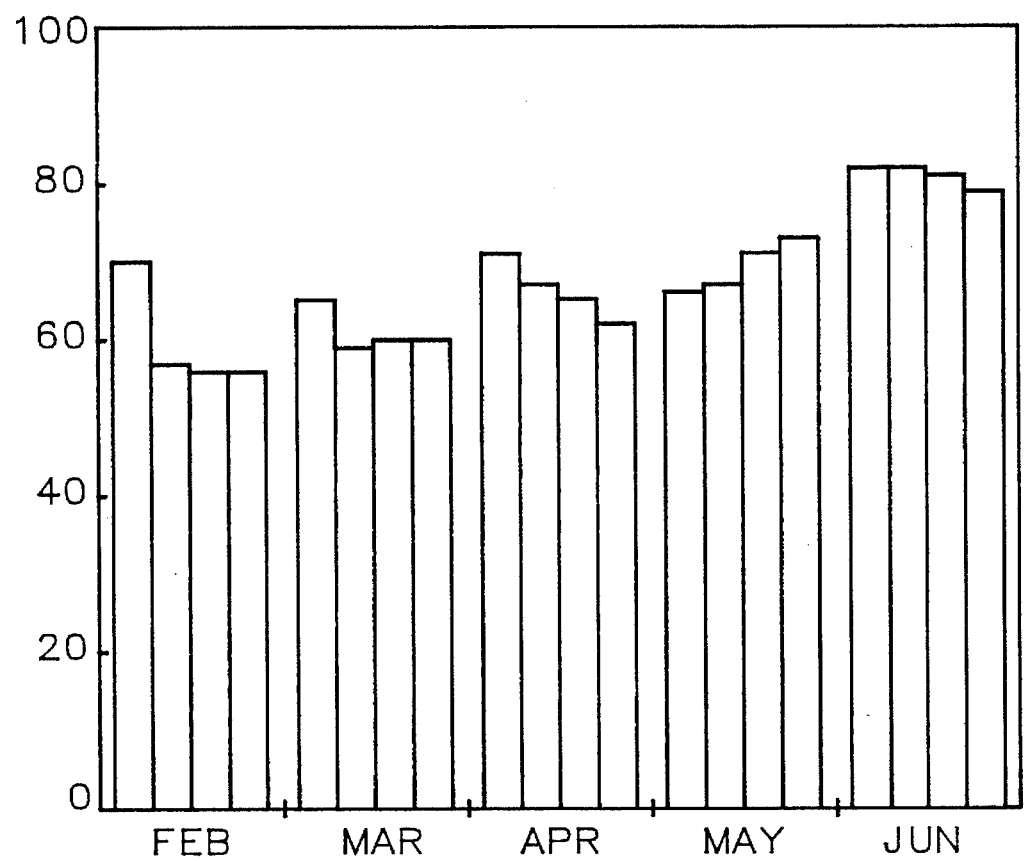
FIG. 10 shows a bar chart of the data in FIG. 9.

According to the definition stated above, the value of FCLIP is calculated by weeks. FIG. 9 shows a Table reflecting the variability of product delivery for a manufacturing line with a steady production environment from February to June. The result shows that the value of FCLIP increases from 56% in February to 81% in June. FIG. 10 shows a bar chart of the data in FIG. 9.

In the environment of multiple products and multiple process manufacturing, there are several targets of concern for lot dispatching such as due date, production cycle time and machine utilization. There is no dispatching rule which is perfect. However, to pick a target due date the SLACK & OTD system fulfills requirements. It reflects the current situation of lot status and dynamically revelations during operation of the manufacturing system. The result is that the index of delivery performance is improved significantly.

When the delivery status steadies, product scheduling becomes more precise. While this system cannot satisfy all concerns, it provides a standard for lot dispatching verified as effective.

SUMMARY

The manufacturing process involved in the integrated circuit (IC) fabrication is complex and unique. A wafer may visit the same machine several times and repeatedly return to the same stage for different processes that construct a flexible, but sophisticated, module and a re-entrant process flow. Under this environment, there are several factors being considered as the performance measure like machine utilization, throughput, due date and stage cycle time for production scheduling. Lots of dispatching rules have therefore been developed to fulfill the objective.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing control system by computer control of work flow in automatic control of a manufacturing production line,
   providing comparison from positive data and negative feedback data,
   providing input TTDD data and TSSC data as a positive input,
   providing comparison output from said TTDD data, said TSSC data and from said negative feedback data,
   providing a SLACK & OTD control processing in response to the output from said comparison output, said SLACK & OTD control processing providing FFOT and QT output data,
   said FFOT and QT output data being provided to said feedback input for said comparison,
   whereby automation of production control of a manufacturing process is provided by improved automation of work scheduling.

2. A method of manufacturing in accordance with claim 1 wherein
   quantity control is provided based upon said FFOT and QT output data.

3. A method of manufacturing in accordance with claim 2 wherein
   said quantity control provided based upon said FFOT and QT output data is provided by reviewing product to determine whether product is adequate or inadequate, and resetting as first priority in the case of inadequate product.

4. A method of manufacturing in accordance with claim 1 wherein
   quantity control is provided based upon said FFOT and QT output data by reviewing product to determine whether product is adequate or inadequate, and resetting as first priority in the case of inadequate product.

5. A method of manufacturing in accordance with claim 1 wherein $$FFOTij=Rj*CCRi*PCTij*F.$$

6. A method of manufacturing in accordance with claim 2 wherein $$FFOTij=Rj*CCRi*PCTij*F.$$

7. A method of manufacturing in accordance with claim 3 wherein $$FFOTij=Rj*CCRi*PCTij*F.$$

8. A method of manufacturing in accordance with claim 4 wherein $$FFOTij=Rj*CCRi*PCTij*F.$$

9. A method of manufacturing in accordance with claim 1 wherein $$OTD=TSC-QT.$$

10. A method of manufacturing in accordance with claim 2 wherein $$OTD=TSC-QT.$$

11. A method of manufacturing in accordance with claim 3 wherein $$OTD=TSC-QT.$$

12. A method of manufacturing in accordance with claim 4 wherein $$OTD=TSC-QT.$$

13. A method of manufacturing in accordance with claim 5 wherein $$OTD=TSC-QT.$$

14. A method of manufacturing in accordance with claim 6 wherein $$OTD=TSC-QT.$$

15. A method of manufacturing in accordance with claim 7 wherein $$OTD=TSC-QT.$$

16. A method of manufacturing in accordance with claim 8 wherein $$OTD=TSC-QT.$$

17. A manufacturing control system including computer control of work flow in automatic control of a manufacturing production line,
   a comparator having a positive input and a negative input,
   an input line providing TTDD data to said positive input,
   an input line providing TSSC data to said positive input,
   an output line from said comparator,
   a SLACK & OTD controller having an input connected to the output line from said comparator and having an FFOT and QT output line,
   said FFOT and QT output line being coupled to said negative input of said comparator,
   whereby automation of production control of a manufacturing process is provided by automation of scheduling of work.

18. A manufacturing system in accordance with claim 17 wherein quantity control is provided based upon said FFOT and QT output data.

19. A manufacturing system in accordance with claim 18 wherein said quantity control provided based upon said FFOT and QT output data is provided by reviewing product to determine whether product is adequate or inadequate, and resetting as first priority in the case of inadequate product.

20. A manufacturing system in accordance with claim 17 wherein quantity control is provided based upon said FFOT and QT output data by reviewing product to determine whether product is adequate or inadequate, and resetting as first priority in the case of inadequate product.

21. A manufacturing system in accordance with claim 17 wherein $$FFOTij=Rj*CCRi*PCTij*F.$$

22. A manufacturing system in accordance with claim 18 wherein $$FFOTij=Rj*CCRi*PCTij*F.$$

23. A manufacturing system in accordance with claim 19 wherein $$FFOTij=Rj*CCRi*PCTij*F.$$

24. A manufacturing system in accordance with claim 20 wherein $$FFOTij=Rj*CCRi*PCTij*F.$$

25. A manufacturing system in accordance with claim 17 wherein $$OTD=TSC-QT.$$

26. A manufacturing system in accordance with claim 18 wherein $$OTD=TSC-QT.$$

27. A manufacturing system in accordance with claim 19 wherein $$OTD=TSC-QT.$$

28. A manufacturing system in accordance with claim 20 wherein $$OTD=TSC-QT.$$

29. A manufacturing system in accordance with claim 21 wherein $$OTD=TSC-QT.$$

30. A manufacturing system in accordance with claim 22 wherein $$OTD=TSC-QT.$$

31. A manufacturing system in accordance with claim 23 wherein $$OTD=TSC-QT.$$

32. A manufacturing system in accordance with claim 24 wherein $$OTD-TSC-QT.$$

* * * * *